US005204540A

United States Patent [19]
Nakashima et al.

[11] Patent Number: 5,204,540
[45] Date of Patent: Apr. 20, 1993

[54] RESIN SEALED SEMICONDUCTOR DEVICE FOR USE IN TESTING AND EVALUATION METHOD OF STRESS DUE TO RESIN SEAL

[75] Inventors: Yuichi Nakashima; Shintaro Matsuda, both of Hyogo, Japan

[73] Assignee: Mitsubishi Denki Kabushiki Kaisha, Tokyo, Japan

[21] Appl. No.: 673,655

[22] Filed: Mar. 21, 1991

[30] Foreign Application Priority Data

Mar. 26, 1990 [JP] Japan .................................. 2-78282

[51] Int. Cl.⁵ ............................................. H01L 23/48
[52] U.S. Cl. ................................... 257/480; 257/415; 257/417; 257/787; 324/158 R
[58] Field of Search ............................ 357/72, 25, 26; 324/158 R

[56] References Cited

U.S. PATENT DOCUMENTS 5,045,918 9/1991 Cagan et al. .......................... 357/72

OTHER PUBLICATIONS

Solid-State electronics by Korsh et al "Conduction Properties of Lightly Doped, Polycrystalline Silicon", vol. 21, pp. 1045-1051. Mar. 21, 1991.

*Primary Examiner*—Edward Wojciechowicz
*Attorney, Agent, or Firm*—Lowe, Price, LeBlanc & Becker

[57] ABSTRACT

A resin sealed semiconductor device for use in testing is disclosed, in which a first MOS field effect transistor is formed in a region within 100 μm from an outer perimeter of a main surface of a silicon substrate, and a second MOS field effect transistor is formed in a region 100 μm or more distant from an outer perimeter of the main surface, and the first and second MOS field effect transistors are encapsulated with resin. Dimensions and materials of the first MOS field effect transistor and the second MOS field effect transistor are identical. By comparing the electric characteristics of the first MOS field effect transistor and the electric characteristics of the second MOS field effect transistor, the effect produced on the MOS field effect transistors by the mechanical stresses due to the resin seal applied from a side direction of silicon substrate can be evaluated.

13 Claims, 11 Drawing Sheets

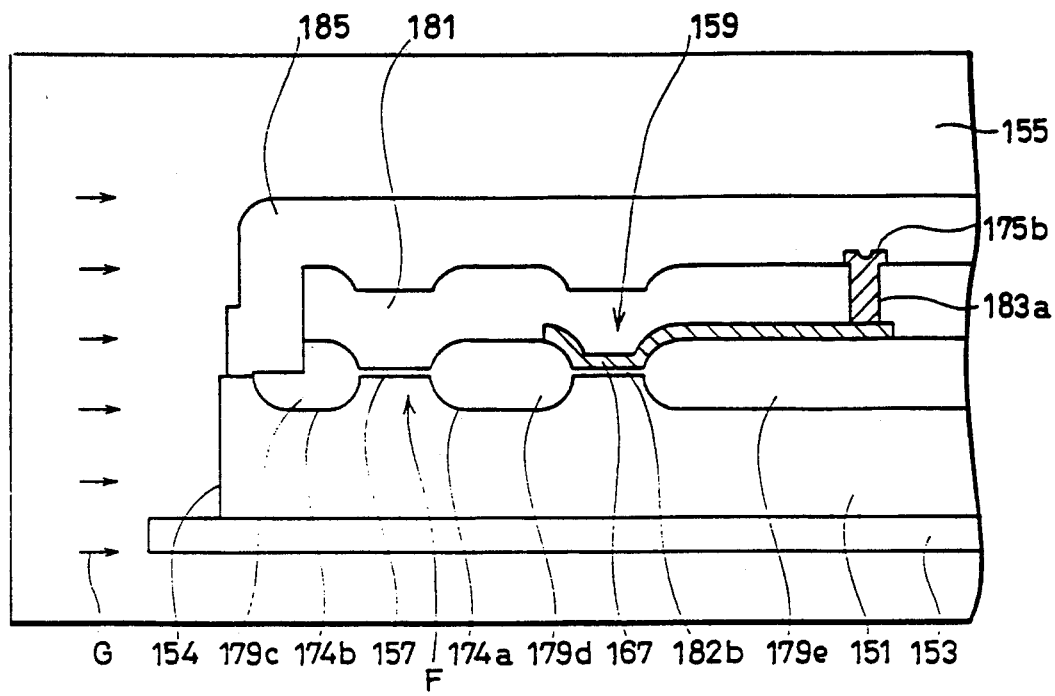
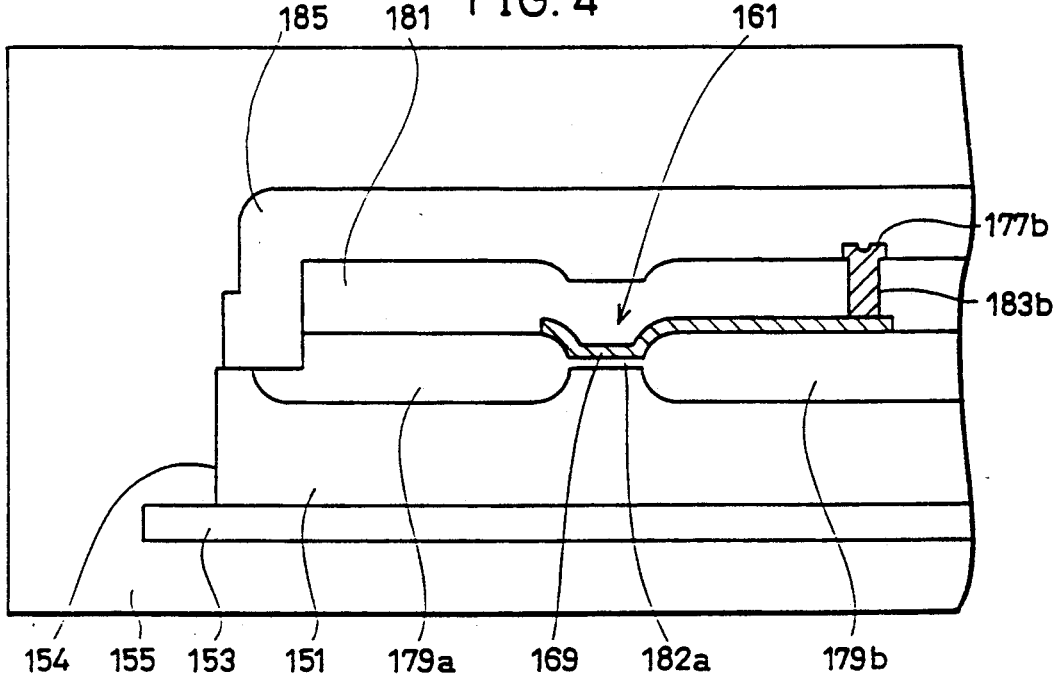

RESIN SEALED SEMICONDUCTOR DEVICE FOR USE IN TESTING AND EVALUATION METHOD OF STRESS DUE TO RESIN SEAL

BACKGROUND OF THE INVENTION

1. Field of the Invention

The present invention relates to a resin sealed semiconductor device for use in testing employed for measuring effects exerted upon electronic elements by mechanical stresses due to resin seal, and a method for evaluation of the mechanical stresses due to the resin seal.

2. Description of the Background Art

When manufacturing a semiconductor device using electronic elements with dimensions, materials and the like different from those of conventional ones, it is necessary to give a test to see if these electronic elements have desired performance or not. In such a case, electronic elements with dimensions, materials and the like different from those of conventional ones are formed on a semiconductor chip for use in testing, and a test is performed using these electronic elements. The semiconductor chip for use in testing is referred to as a TEG (Test Element Group) chip. The structure of a conventional TEG chip will be described referring to FIGS. 7, 8 and 9.

As shown in FIG. 7, the TEG chip 1 has electronic elements (not shown in FIG. 7) formed on a main surface of a silicon substrate 3.

The TEG chip 1 is affixed on a main surface of a die pad 5. Bonding pads 7 are formed on end portions of the main surface of the silicon substrate 3. There are external leads 11 in the vicinities of side portions of the TEG chip 1. The external lead 11 and the bonding pad 7 are electrically connected by a wire 9. A part of an external lead 11, silicon substrate 3, die pad 5, bonding pad 7 and wire 9 are encapsulated with resin 13.

FIG. 8 is a plan view of the TEG chip 1 shown in FIG. 7. Silicon substrate 3 is affixed to the main surface of the die pad 5. A plurality of bonding pads 7 are formed on the side portions of the main surface of the silicon substrate 3. There are a plurality of external leads 11 in the vicinities of the side portions of silicon substrate 3. External leads 11 and bonding pads 7 are electrically connected by wire 9.

The main surface of silicon substrate 3 is divided into a MOS field effect transistor forming region 15, a capacitor forming region 17, a diode forming region 19, and an interconnection forming region 21. The broken lines in FIG. 8 indicate boundaries of the respective forming regions. No broken lines exist on a main surface of an actual silicon substrate 3. A part of leads 11, silicon substrate 3, bonding pads 7, die pad 5 and wires 9 are encapsulated with resin 13.

FIG. 9 is an enlarged view of a part indicated by E in FIG. 8. The region designated by E is within the MOS field effect transistor forming region designated by 15 in FIG. 8.

MOS field effect transistors 23a, 23b and 23c are respectively formed in the main surface of the silicon substrate 3. A plurality of bonding pads 7 are formed at end portions of the main surface of silicon substrate 3.

MOS field effect transistor 23a is provided with an impurity region 25a and a gate electrode 27a. The impurity region 25a is formed in the main surface of silicon substrate 3. Gate electrode 27a extends over impurity region 25a. Impurity region 25a is divided into two regions by gate electrode 27a. One region of impurity region 25a and bonding pad 7 are electrically connected by an aluminum interconnection layer 29a. Gate electrode 27a and bonding pad 7 are electrically connected by an aluminum interconnection layer 29b. The other region of impurity region 25a and bonding pad 7 are electrically connected by an aluminum interconnection layer 29c. $L_1$ designates a gate length of gate electrode 27a.

MOS field effect transistor 23b is provided with a gate electrode 27b and impurity region 25b. Impurity region 25b is formed on the main surface of silicon substrate 3. Gate electrode 27b extends over impurity region 25b. Impurity region 25b is divided into two region 25b and bonding pad 7 are electrically connected by an aluminum interconnection layer 29d. Gate electrode 27b and bonding pad 7 are electrically connected by an aluminum interconnection layer 29e. The other region of impurity region 25b and bonding pad 7 are electrically connected by an aluminum interconnection layer 29f. $L_2$ designates a gate length of gate electrode 27b.

MOS field effect transistor 27c is provided with an impurity region 25c and a gate electrode 27c. Impurity region 25c is formed on the main surface of silicon substrate 3. Gate electrode 27c extends over impurity region 25c. Impurity region 25c is divided into two regions by gate electrode 27c. One region of impurity region 25c and bonding pad 7 are electrically connected by an aluminum interconnection layer 29g. Gate electrode 27c and bonding pad 7 are electrically connected by an aluminum interconnection layer 29h. The other region of impurity region 25c and bonding pad 7 are electrically connected by an aluminum interconnection layer 29i. $L_3$ designates a gate length of gate electrode 27c.

Although the gate lengths of MOS field effect transistors 23a, 23b and 23c are different from each other, their materials, shapes or the like are identical. When manufacturing a semiconductor device using a MOS field effect transistor with gate length $L_1$ in the case of there is no semiconductor device manufactured by using a MOS field effect transistor with gate length $L_1$, various tests are performed for MOS field effect transistor 23a to evaluate a MOS field effect transistor with gate length $L_1$. Alternatively, variation of MOS field effect transistor characteristics of different gate lengths may be examined by comparing the results of the same test with respect to MOS field effect transistors 23a, 23b and 23c.

Description about what kinds of tests are performed with respect to MOS field effect transistors will be given referring to FIG. 10. A gate of a MOS field effect transistor is designated with 31. A source of the MOS field effect transistor is designated with 33. A drain of the MOS field effect transistor is designated with 35. A positive electrode of power source 37a and gate 31 are electrically connected. A negative electrode of power source 37a and source 33 are electrically connected. One electrode of a voltmeter 39a and gate 31 are electrically connected. A positive electrode of a power source 37b and drain 35 are electrically connected. A negative electrode of a power source 37b and one electrode of a voltmeter 41 are electrically connected. Drain 35 and one electrode of a voltmeter 39b are electrically connected.

A gate voltage is measured using voltmeter 39a. A drain current is measured employing ammeter 41. A drain voltage is measured employing voltmeter 39b.

The semiconductor chip is encapsulated with resin. The purpose is to avoid semiconductor element characteristic degradation due to effect of exterior atmosphere. However, it is known that, if a semiconductor chip is encapsulated with resin, mechanical stresses due to resin shrinkage are applied to the semiconductor element, so that the electric characteristics of the semiconductor element is degraded. A TEG chip 1 is also encapsulated with resin 13 as shown in FIG. 7 to implement the same conditions as that of a semiconductor chip. Mechanical stresses are applied to the TEG chip 1 in the direction designated by arrows in FIG. 7.

The degradation of electric characteristics of a semiconductor element due to resin seal will be described referring to test results. FIG. 11 is a sectional view of a semiconductor element employed in this test. This semiconductor element is a MOS capacitor 67. MOS capacitor 67 is provided with a silicon substrate 69, a silicon oxide film 73 and a polysilicon film 75.

A field oxide film 71 is formed at the both ends of the main surface of silicon substrate 69. A silicon oxide film 73 is formed between field oxide films 71 on the main surface of silicon substrate 69. A polysilicon film 75 is formed on field oxide film 71 and silicon oxide film 73. An electrode 77 is formed on one end of polysilicon film 75. Electrode 77 and a positive electrode of power source 79 are electrically connected. A negative electrode of power source 79 is grounded.

The resin sealed TEG chip provided with MOS capacitor 67 shown in FIG. 11 and no-resin sealed TEG chip provided with MOS capacitor 67 shown in FIG. 11 were prepared. Electrical stresses were applied to the MOS capacitors by continuously flowing constant current to the MOS capacitors formed on these TEG chips to shift flat-band voltages of the MOS capacitors by a fixed amount. The flat-band voltage means a voltage applied to polysilicon film 75 to make potential at an interface of silicon substrate 69 and silicon oxide film 75 equal to potential in silicon substrate 69. If the flat-band voltage of a semiconductor element shifts, electrical characteristics of the semiconductor element are degraded.

The times required for shifting the flat-band voltage were measured with respect to constant current densities of 10 $pA/cm^2$, 20 $pA/cm^2$ and 40 $pA/cm^2$, respectively. The amount of the flat-band voltage shift is always the same in all cases.

The constant current density designates a value found out by dividing the value of constant current by the area of a portion existing on silicon oxide film 73 of polysilicon electrode 75 shown in FIG. 11. The time required for shifting a certain amount of flat-band voltage of the MOS capacitor of no-resin sealed TEG chip with constant current density of 10 $pA/cm^2$ is assumed to be 100.

FIG. 12 is a graph showing the results. The broken line shows the test results of a MOS capacitor of no-resin sealed TEG chip and the solid line shows test results of the MOS capacitor of a resin sealed TEG chip. As shown in FIG. 12, excepting the constant current density of 40 $pA/cm^2$, the MOS capacitor of the no-resin sealed TEG chip requires a longer time period for shifting the flat-band voltage than the MOS capacitor of the resin sealed TEG chip. As described above, shifting of the flat-band voltage causes degradation of electrical characteristics of a semiconductor element.

Accordingly, resin seal of a semiconductor chip facilitates electric characteristic degradation of a semiconductor element.

Some semiconductor devices have elements formed on end portions of main surfaces of semiconductor substrates. The element formed on end portions of main surfaces of the semiconductor substrates will be described referring to FIGS. 13 and 14.

FIG. 13 is a partial plan view of a semiconductor device having elements formed on the end portion of the main surface of the semiconductor substrate. Silicon substrate 43 is affixed to die pad 45. A plurality of MOS field effect transistors 55 are formed on the main surface of silicon substrate 43. Bonding pads 47 are also formed on the main surface of silicon substrate 43. There are external leads 51 around a side portion of silicon substrate 43. External lead 51 and bonding pad 47 are electrically connected by wire 49. Silicon substrate 43 is encapsulated with resin 53.

FIG. 14 is a sectional view of FIG. 13 taken along the direction designated by the arrow A. Silicon substrate 43 is affixed to die pad 45. A field oxide film 57 and a gate oxide film 59 are formed on the main surface of silicon substrate 43. Gate oxide film 59 is interposed between field oxide films 57. Gate electrode 61 is formed on gate oxide film 59. An interlayer insulating film 63 is formed on gate electrode 61. A passivation film 65 is formed on interlayer insulating film 63. Silicon substrate 43 is sealed with resin 53 A semiconductor device having elements formed on the end portion of the main surface of the semiconductor substrate includes one illustrated in IEEE (The Institute of Electrical and Electronics Engineers)/IRPS (International Reliability Physics Society) 23rd, 1985, p. 230.

Now, with respect to a resin sealed semiconductor device, it is known that electrical characteristic degradation advances faster in elements formed on end portions of a main surface of a semiconductor substrate than elements formed on a center portion of the main surface of the semiconductor substrate. It seems that this occurs because of the following reasons. Referring to FIG. 14, mechanical stresses due to the resin seal are applied from top, bottom and side directions of silicon substrate 43. The arrows indicate directions of the mechanical stresses. The magnitude of the mechanical stress downwardly (in the top direction) applied to an element formed in the central portion of the main surface of silicon substrate 43 is equal to the magnitude of the mechanical stress downwardly applied to an element formed in the end portion of the main surface of silicon substrate 43. The magnitude of the mechanical stress upwardly (in the bottom direction) applied to an element formed in the central portion of the main surface of silicon substrate 43 is equal to the magnitude of the mechanical stress upwardly applied to an element formed in the end portion of the main surface of silicon substrate 43. However, the magnitude of the mechanical stress laterally (in the side direction) applied to an element formed in an end portion of the main surface of silicon substrate 43 is larger than the magnitude of the mechanical stress laterally applied to an element formed in the central portion of the main surface of silicon substrate 43. Accordingly, larger mechanical stresses are applied to an element formed in an end portion of the surface of silicon substrate 43 than an element formed in the central portion of the main surface of silicon substrate 43. Thus, the electric characteristic of an element formed in an end portion of the main surface of silicon substrate 43 is degraded faster than an element formed in the central portion of the main surface of silicon substrate 43.

Especially, in elements formed at positions located within 100 μm from a perimeter of a main surface of a silicon substrate are liable to electrical characteristic degradation due to mechanical stresses. Semiconductor devices are highly integrated, so that elements are formed even at portions located within 100 μm from the perimeter of the main surface of the silicon substrate. Thus, the problem of electrical characteristic degradation of semiconductor elements due to mechanical stresses can not be neglected.

A TEG chip having elements formed on end portions of a main surface of a semiconductor substrate is now actually manufactured. For example, a TEG chip having elements formed in end portions of a main surface of a semiconductor substrate is disclosed in the "Solid-State Electronics" Vol. 21, pp. 1045. However, what is disclosed in this document is not a TEG chip itself, but a mask pattern. FIG. 15 is a plan view of a mask pattern 81 disclosed in "Solid-State Electronics" Vol. 21, pp. 1045. Mask pattern 81 will be regarded as a TEG chip 81 in the following. A large number of diodes are formed in TEG chip 81. The diodes located at symmetrical positions about an axis line 95 have the same shapes and areas but formed of different materials. For example, diode 82 is formed in polysilicon layer 87. Polysilicon layer 87 and bonding pad 83 are electrically connected by interconnection layer 85.

Diode 94 is formed in an epitaxial layer 93. Epitaxial layer 93 and bonding pad 89 are electrically connected by interconnection layer 91. Diode 82 and diode 94 are located at symmetrical positions about axix line 95.

However, in TEG chip 81 shown in FIG. 15, the elements were not formed on end portions in consideration of the fact that elements in the end portion are supplied with larger mechanical stresses.

Furthermore, as a plurality of TEG chips are manufactured out of a piece of a wafer, a plurality of electronic elements having the same types, dimensions and materials were not formed in a single TEG chip. Accordingly, in a conventional TEG chip, a comparison could not be made between electronic elements with the same types, dimensions and materials formed at positions where different amounts of mechanical stresses are applied to.

SUMMARY OF THE INVENTION

The present invention has been made to solve such conventional problems. An object of the present invention is to provide a resin sealed semiconductor device for use in testing having structure in which comparison can be made among electronic elements of the same type, dimensions and material formed at positions to which different effects of mechanical stresses due to the resin seal are exerted.

Another object of the present invention is to provide a method for evaluating mechanical stresses due to resin seal applied to electronic elements formed at positions within 100 μm (100 μm or less distant) from a perimeter of a main surface of a semiconductor substrate.

Still another object of the present invention is to provide a resin sealed semiconductor device for use in testing having structure in which electronic elements can be formed in the vicinity of the perimeter of a substrate main surface.

Yet another object of the present invention is to provide a resin sealed semiconductor device for use in testing having a structure in which, although a first electronic element and a second electronic element are adjacent to each other, the effect of mechanical stress due to resin seal on the first electronic element and the effect of mechanical stress due to resin seal on the second electronic element are different.

The resin sealed semiconductor device for use in testing is provided with a semiconductor substrate and first and second electronic elements. The first and the second electronic elements are formed in the main surface of the semiconductor surface. The semiconductor substrate having the first and the second electronic elements is encapsulated with resin. Employing this resin sealed semiconductor device for use in testing, the effects of mechanical stresses on electric characteristics of the first and the second electronic elements due to the resin seal are examined. The resin sealed semiconductor device for use in testing according to the present invention are characterized by the following. Types, dimensions and materials of the first and the second electronic elements are identical. Mechanical stresses of different strength are supplied from a side direction to the position where the first electronic element is formed and the position where the second electronic element is formed on a semiconductor substrate.

The evaluation method of stresses due to the resin seal according to the present invention includes the following steps. Electronic elements are formed in a region of not more than 100 μm from a perimeter of a main surface of a semiconductor substrate. Next, the semiconductor substrate provided with electronic elements is encapsulated with resin. Next, by measuring electrical characteristics of the electronic elements, the mechanical stresses due to the resin seal applied to the electronic elements from the side direction are evaluated.

Another method of evaluating stresses due to resin seal includes the following steps. A first electronic element is formed on a main surface of a semiconductor substrate. Next, a second electronic element of the same type, dimensions and materials as those of the first electronic element is formed on the main surface of the semiconductor substrate. Next, the semiconductor substrate having the first and the second electronic elements are encapsulated with resin. The mechanical stress due to resin seal applied to the semiconductor substrate in the side direction is larger at the position where the second electronic element is formed than the position where the first electronic element is formed. Subsequently, by comparing and evaluating electric characteristic of the first and the second electronic elements, the mechanical stresses directed from side directions of the semiconductor substrate are evaluated.

A resin sealed semiconductor device for use in testing according to the present invention has a first electronic element and a second electronic element of which types, dimensions and materials are identical. The strengths of mechanical stresses directed to side surfaces of the semiconductor substrate are different at the position where the first electronic element is formed and at the position where the second electronic element is formed. Accordingly, by comparing the electric characteristics of the first electronic element and the electric characteristics of the second electronic element, the effects of the mechanical stresses due to resin seal applied in a side direction to the semiconductor substrate can be evaluated.

In accordance with the method of evaluating stresses due to resin seal according to the present invention, electronic elements are formed in a region spaced apart not more than 100 μm from a perimeter of a main surface of a semiconductor substrate. These electronic elements are encapsulated with resin. Subsequently, focusing on the fact that the electronic elements are located in a region of not more than 100 μm from a perimeter of the main surface of the semiconductor substrate, the electric characteristics of the electronic elements are measured. Thus, it can be evaluated to which extent the mechanical stresses due to resin seal laterally applied to the semiconductor substrate affect the electronic elements in a region of not more than 100 μm from the perimeter of the main surface of the semiconductor substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view taken along the direction of the arrow B of FIG. 2.

FIG. 4 is a sectional view of FIG. 2 taken along the direction of the arrow C.

DESCRIPTION OF THE PREFERRED EMBODIMENTS

Figure 1:
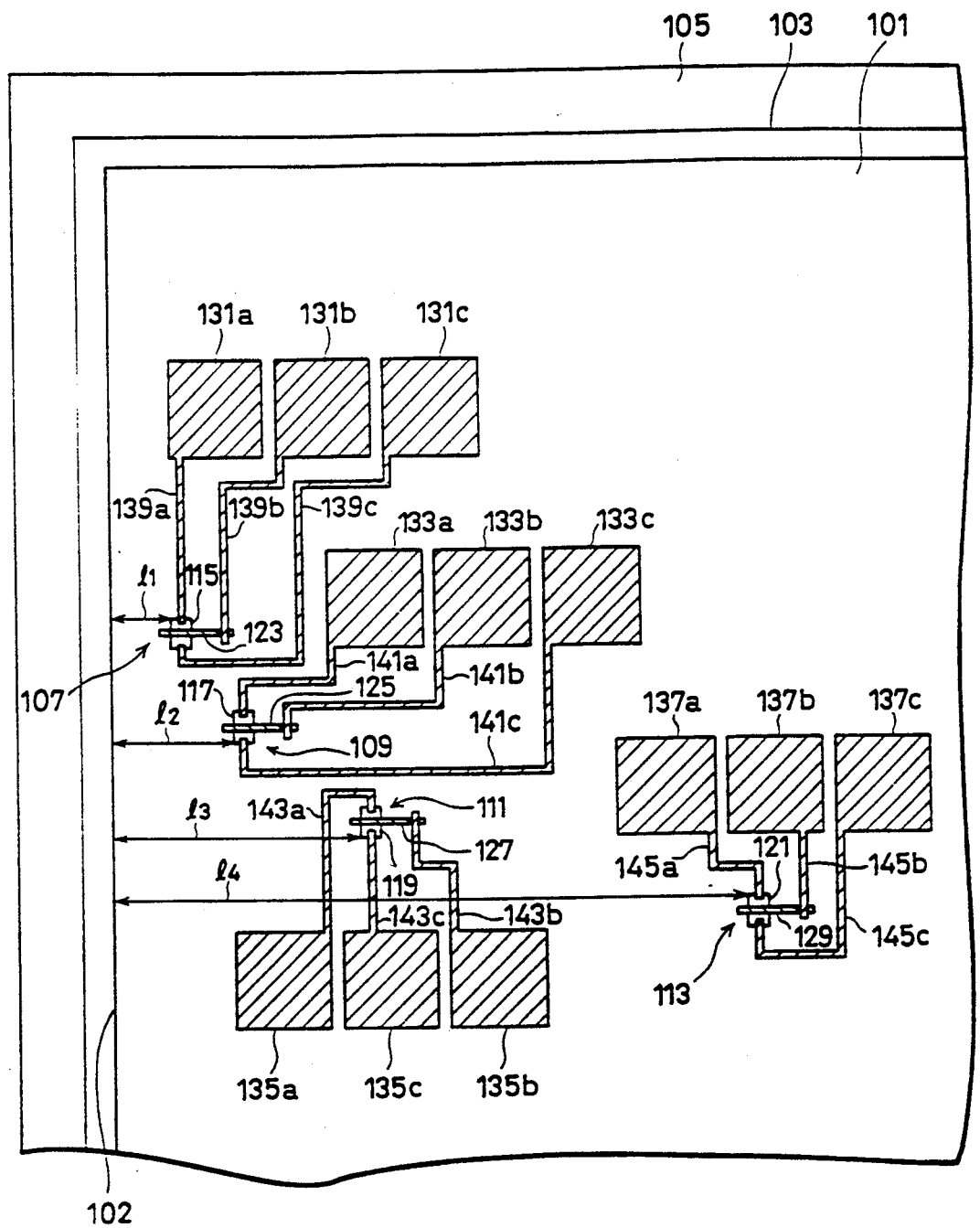
FIG. 1 is an enlarged plan view of a portion in the vicinity of a corner of a substrate main surface of one embodiment of a resin sealed semiconductor device for use in testing according to the present invention.

One embodiment of a resin sealed semiconductor device for use in testing according to the present invention will be described below. FIG. 1 is an enlarged plan view of a portion in the vicinity of a corner of a substrate surface of one embodiment of a resin sealed semiconductor device for use in testing according to the present invention. A silicon substrate 101 is mounted on a die pad 103. MOS field effect transistors 107, 109, 111 and 113 are formed on the main surface of the silicon substrate 101.

MOS field effect transistors 107, 109, 111 and 113 are formed with the same dimensions and materials.

MOS field effect transistor 107 is provided with an impurity region 115 and a gate electrode 123. The impurity region 115 is formed at the main surface of silicon substrate 101. The distance designated by $l_1$ between the outer perimeter 102 and impurity region 115 is 20 μm. Gate electrode 123 extends over impurity region 115. Impurity region 115 is divided into two regions by gate electrode 123.

Bonding pads 131a, 131b and 131c are formed on the main surface of silicon substrate 101. Bonding pads 131a, 131b and 131c are formed outside the region between the outer perimeter 102 and MOS field effect transistor 107. Forming bonding pads 131a, 131b, and 131c in such a region allows the forming region of MOS field effect transistor 107 to exist as near the outer perimeter as desired. One region of impurity region 115 and bonding pad 131a are electrically connected by an aluminum interconnection layer 139a. Gate electrode 123 and bonding pad 131b are electrically connected by an aluminum interconnection layer 139b. The other region of impurity region 115 and bonding pad 131c are electrically connected by an aluminum interconnection layer 139c.

MOS field effect transistor 109 has an impurity region 117 and a gate electrode 125. The distance designated by $l_2$ between the outer perimeter 102 and impurity region 117 is 40 μm. Gate electrode 125 extends over impurity region 117. Impurity region 117 is divided into two regions by gate electrode 125.

Bonding pads 133a, 133b and 133c are formed on the main surface of silicon substrate 101. One region of impurity region 117 and bonding pad 133a are electrically connected by an aluminum interconnection layer 141a. Gate electrode 125 and bonding pad 133b are electrically connected by an aluminum interconnection layer 141b. The other region of impurity region 117 and bonding pad 133c are electrically connected by an aluminum interconnection layer 141c.

MOS field effect transistor 111 is provided with an impurity region 119 and a gate electrode 127. The distance designated by $l_3$ between the outer perimeter 102 and impurity region 119 is 80 μm. Gate electrode 127 extends over impurity region 119. Impurity region 119 is divided into two regions by gate electrode 127. Bonding pads 135a, 135b and 135c are formed on the main surface of silicon substrate 101. One region of impurity region 119 and bonding pad 135a are electrically connected by an aluminum interconnection layer 143a. Gate electrode 127 and bonding pad 135b are electrically connected by an aluminum interconnection layer 143b. The other region of impurity region 119 and bonding pad 135c are electrically connected by an aluminum interconnection layer 143c.

MOS field effect transistor 113 has an impurity region 121 and a gate electrode 129. The distance designated by $l_4$ between the outer perimeter 102 and impurity region 121 is 200 μm. Gate electrode 129 extends over impurity region 121. Impurity region 121 is divided into two regions by gate electrode 129. Bonding pads 137a, 137b and 137c are formed on the main surface of silicon substrate 101. One region of impurity region 121 and bonding pad 137a are electrically connected by an aluminum interconnection layer 145a. Gate electrode 129 and bonding pad 137b are electrically connected by an aluminum interconnection layer 145b. The other region of impurity region 121 and bonding pad 137c are electrically connected by an aluminum interconnection layer 145c. Silicon substrate 101 in which MOS field effect transistors 107, 109, 111 and 113 is encapsulated by resin 105.

With MOS field effect transistors formed at such positions, the electric characteristics of the respective MOS field effect transistors are tested. In this way, to which extent the mechanical stresses due to resin encapsulation from the side direction of silicon substrate affect upon the electric characteristics of the MOS field effect transistors can be evaluated as the distance from the outer perimeter of the main surface of silicon substrate becomes shorter.

In this embodiment, three MOS field effect transistors are formed in the region within 100 μm from the outer perimeter 102 shown in FIG. 1. However, it is not limited to the same in the present invention, and only one MOS field effect transistor may be formed in the region within 100 μm from the outer perimeter 102.

In this embodiment, the test was performed employing MOS field effect transistors. However, in the present invention, it is not limited to the same, any electronic elements constituting an integrated circuit such as a bipolar transistor, a diode or the like may be used.

Figure 2:
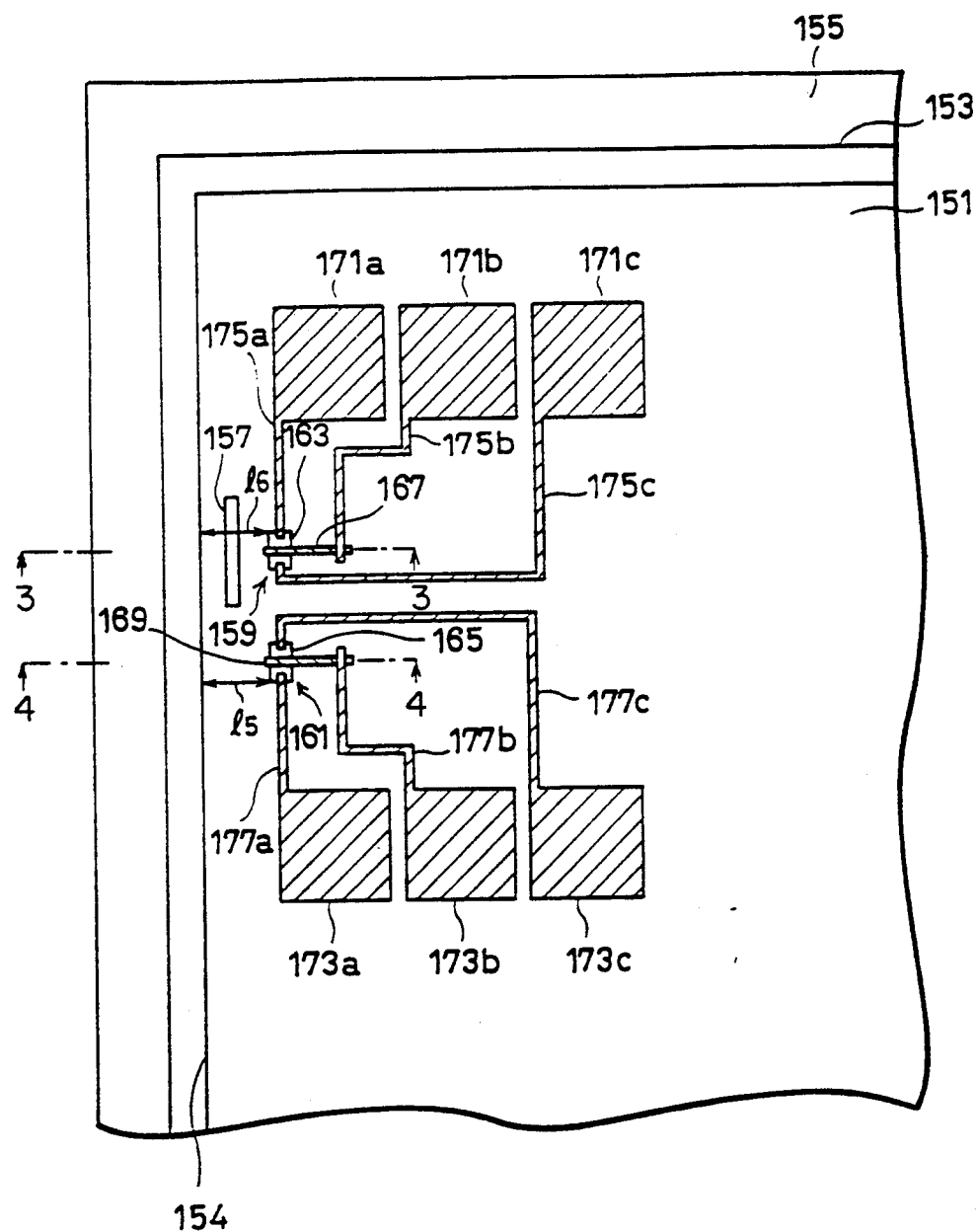
FIG. 2 is an enlarged plan view of a portion in the vicinity of a corner of a substrate main surface of another embodiment of a resin sealed semiconductor device for use in testing according to the present invention.

Another embodiment of a resin sealed semiconductor device for use in testing according to the present invention will be described. FIG. 2 is an enlarged plan view of a portion in the vicinity of a corner of a semiconductor main surface of another embodiment of a resin sealed semiconductor device for use in testing according to the present invention. A silicon substrate 151 is mounted on a die pad 153. MOS field effect transistors 159 and 161 are formed in the main surface of silicon substrate 151. Dimensions and materials of MOS field effect transistors 159 and 161 are identical.

MOS field effect transistor 161 has an impurity region 165 and a gate electrode 169. The distance designated by $l_5$ between an outer perimeter 154 and an impurity region 165 is 20 μm. Gate electrode 169 extends over impurity region 165. Impurity region 165 is divided into two regions by gate electrode 169. Bonding pads 173a, 173b and 173c are formed in the main surface of silicon substrate 151. Bonding pads 173a, 173b and 173c are formed outside the region connecting MOS field effect transistor 161 and outer perimeter 154. One region of impurity region 165 and bonding pad 173a are electrically connected by an aluminum interconnection layer 177a. Gate electrode 169 and bonding pad 173b are electrically connected by an aluminum interconnection layer 177b. The other region of impurity region 165 and bonding pad 173c are electrically connected by an aluminum interconnection layer 177c.

FIG. 4 is a diagram taken along the direction designated by an arrow C of FIG. 2. As shown in FIG. 4, silicon substrate 151 is affixed to die pad 153. Field oxide films 179a, 179b and a gate oxide film 182a are formed in the main surface of silicon substrate 151. Gate oxide film 182a is formed between field oxide film 179a and field oxide film 179b.

A gate electrode 169 is formed on gate oxide film 182a and field oxide film 179b. An interlayer insulating film 181 is formed on gate electrode 169 and field oxide film 179a. In the interlayer insulating film 181 located on gate electrode 169, a contact hole 183b is formed. An aluminum interconnection layer 177b is formed on interlayer insulating film 181. Aluminum interconnection layer 177b and gate electrode 169 are electrically connected by the aluminum filled in contact hole 183b. A passivation film 185 is formed on interlayer insulating film 181. Silicon substrate 151 on which surface a passivation film 185 and the like are formed is encapsulated by resin 155.

Turning again to FIG. 2, MOS field effect transistor 159 has an impurity region 163 and a gate electrode 167. The distance designated by $l_6$ between outer perimeter 154 and impurity region 163 is 20 μm. A thin silicon oxide film 157 is formed on the main surface of silicon substrate 151 interposed between outer perimeter 154 and impurity region 163. A thick field oxide film is formed in regions except for thin silicon oxide film 157, impurity region 165 and impurity region 163. Here, the field oxide film is not shown in FIG. 2. Gate electrode 167 extends over impurity region 163. Impurity region 163 is divided into two regions by gate electrode 167.

Bonding pads 171a, 171b and 171c are formed in the main surface of silicon substrate 151. Bonding pads 171a, 171b and 171c are formed outside the region connecting MOS field effect transistor 159 and outer perimeter 154. One region of impurity region 163 and bonding pad 171a are electrically connected by an aluminum interconnection layer 175a. Gate electrode 167 and bonding pad 171b are electrically connected by an aluminum interconnection layer 175b. The other region of impurity region 163 and bonding pad 171c are electrically connected by an aluminum interconnection layer 175c.

FIG. 3 is a diagram taken along the direction designated by an arrow B of FIG. 2. As shown in FIG. 3, silicon substrate 151 is affixed to die pad 153. Field oxide films 179c, 179d and 179e, a thin silicon oxide film 157 and a gate oxide film 182b are formed in the main surface of silicon substrate 151. Thin silicon oxide film 157 is formed between filed oxide film 179c and field oxide film 179d. Gate oxide film 182b is formed between field oxide film 179d and field oxide film 179e.

Gate electrode 167 is formed on gate oxide film 182b oxide film 179e. An interlayer insulating film 181 is formed on filed oxide film 179c, thin silicon oxide film 157, field oxide film 179d and gate electrode 167. A contact hole 183a is formed in interlayer insulating film 181 located on gate electrode 167. An aluminum interconnection layer 175b is formed on interlayer insulating film 181. Aluminum interconnection layer 175b and gate electrode 167 are electrically connected by aluminum filled in contact hole 183a. A passivation film 185 is formed on interlayer insulating film 181. Silicon substrate 151 in which passivation film 185 and the like are formed is encapsulated by resin 155.

As seen by comparing FIG. 3 and FIG. 4, the structure in the region connecting MOS field effect transistor 159 and outer perimeter 154 shown in FIG. 3 and the structure in the region connecting MOS field effect transistor 161 and outer perimeter 154 shown in FIG. 4 are different in the form. Implementing the structure in the region connecting MOS field effect transistor 159 and outer perimeter 154 as shown in FIG. 3 produces the effects as described below. As shown in FIG. 3, concaves 174a and 174b are formed in the main surface of silicon substrate 151. Concave portion 174b is filled with field oxide film 179c. Concave portion 174a is filled with field oxide film 179d. There is a portion designated by F of silicon substrate 151 between concave portions 174a and 174b.

Silicon substrate 151 is formed of silicon. The longitudinal elastic coefficient of silicon is $1.7 \times 10^{12}$ dyn/cm$^2$. Field oxide film 179c is formed of silicon dioxide. The longitudinal elastic coefficient of silicon dioxide is $0.7 \times 10^{12}$ dyn/cm$^2$. As seen by comparing the longitudinal elastic coefficient of silicon and the longitudinal elastic coefficient of silicon dioxide, field oxide film 179c is more elastic than silicon substrate 151. The arrow G indicates the direction of mechanical stresses due to the resin seal. The mechanical stresses from the arrow G direction are directed to MOS field effect transistor 159 from the side direction of silicon substrate 151. The mechanical stresses applied from the direction of the arrow G are absorbed by field oxide film 179c more elastic than silicon substrate 151 to be weakened. The weakened mechanical stresses are prevented from being transmitted to the MOS field effect transistor 159 forming region side by a portion of silicon substrate 151 designated by the arrow F.

Accordingly, MOS field effect transistor 159, although it is located at a position 20 μm distant from the outer perimeter of silicon substrate 151, is not affected so much by the mechanical stresses in a side direction. As it is not so much affected by the mechanical stresses in a side direction, MOS field effect transistor 159 is in the same conditions as those of a MOS field effect transistor formed in a central portion of silicon substrate 151. Accordingly, as shown in FIG. 2, MOS field effect transistor 161 considerably affected by the stresses from the side direction of silicon substrate 151 among mechanical stresses due to the resin seal and MOS field effect transistor 159 which is not considerably subjected to the same can be made at adjacent positions. Thus, when observing MOS field effect transistor 159 after observing MOS field effect transistor 161 with a microscope, it is easy to find out MOS field effect transistor 159.

Referring to FIG. 3, a portion of silicon substrate 151 designated by F prevents the mechanical stresses in a side direction from being transmitted to the MOS field effect transistor 159 forming region. Accordingly, a portion of silicon substrate 151 designated by F serves as a stress transmission preventing means. Field oxide film 179c absorbs and weakens the mechanical stresses in a side direction. Consequently, field oxide film 179c serves as a stress absorbing means.

As shown in FIG. 3, field oxide film 179c is employed as stress absorbing means in this embodiment. However, it is not limited to the same in this invention, and any member which is more elastic than silicon substrate 151 and has insulating characteristic may be employed.

Figure 5:
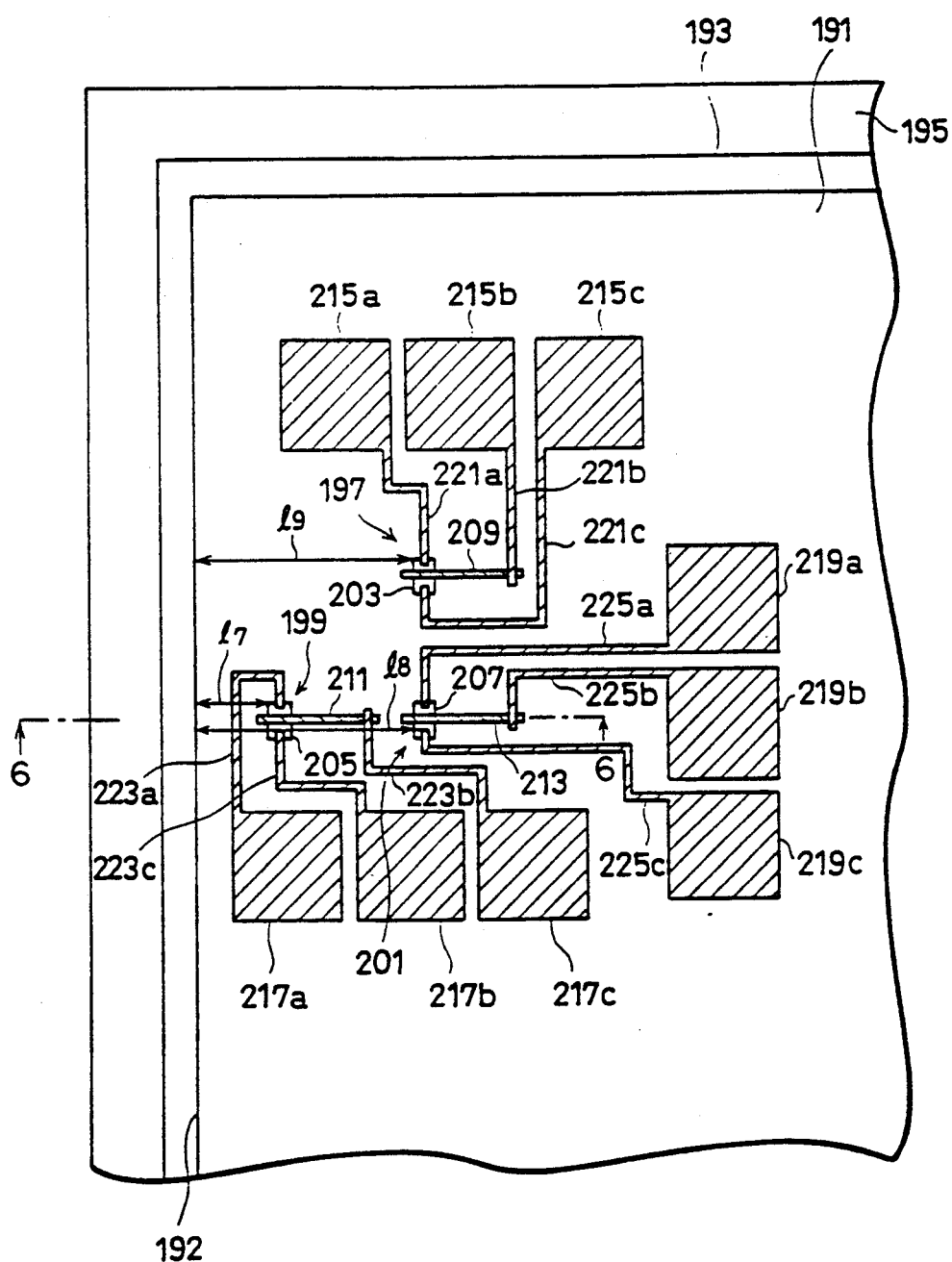
FIG. 5 is an enlarged plan view of a portion in the vicinity of a corner of a semiconductor main surface of still another embodiment of a resin sealed semiconductor device for use in testing according to the present invention.

As shown in FIG. 3, in this embodiment, a portion of silicon substrate 151 designated by F serves as stress transmission preventing means. However, it is not limited to the same in the present invention, and any substances harder than the stress absorbing means may be employed Yet another embodiment of a resin sealed semiconductor device for use in testing according to the present invention will be described. FIG. 5 is an enlarged plan view of a portion in the vicinity of a corner of a substrate main surface of yet another embodiment of a resin sealed semiconductor device for use in testing according to the present invention. A silicon substrate 191 is mounted on a die pad 193. MOS field effect transistors 197, 199 and 201 are formed in the main surface of silicon substrate 191. Dimensions and materials of MOS field effect transistors 197, 199 and 201 are identical.

MOS field effect transistors 197 has an impurity region 203 and a gate electrode 209. The distance designated by $l_9$ between an outer perimeter 192 and an impurity region 203 is 60 μm. Gate electrode 209 extends over impurity region 203. Impurity region 203 is divided into two regions by gate electrode 209. Bonding pads 215a, 215b and 215c are formed in the main surface of silicon substrate 191. One region of impurity region 203 and bonding pad 215a are electrically connected by an aluminum interconnection layer 221a. Gate electrode 209 and bonding pad 215b are electrically connected by an aluminum interconnection layer 221b. The other region of impurity region 203 and bonding pad 215c are electrically connected by an aluminum interconnection layer 221c.

MOS field effect transistor 199 has an impurity region 205 and a gate electrode 211. The distance designated by $l_7$ between outer perimeter 192 and impurity region 205 is 20 μm. Gate electrode 211 extends over impurity region 205. Impurity region 205 is divided into two regions by gate electrode 211. Bonding pads 217a, 217b and 217c are formed in the main surface of silicon substrate 191. Bonding pads 217a, 217b and 217c are formed outside the region connecting MOS field effect transistor 199 and outer perimeter 192. One region of impurity region 205 and bonding pad 217a are electrically connected by an aluminum interconnection layer 223a. Gate electrode 211 and bonding pad 217c are electrically connected by an aluminum interconnection layer 223b. The other region of impurity region 205 and bonding pad 217b are electrically connected by an aluminum interconnection layer 223c.

MOS field effect transistor 201 has an impurity region 207 and a gate electrode 213. The distance designated by $l_8$ between outer perimeter 192 and impurity region 207 is 60 μm. There is impurity region 205 of MOS field effect transistor 199 on the shortest distance between impurity region 207 and outer perimeter 192. Gate electrode 213 extends over impurity region 207. Impurity region 207 is divided into two regions by gate electrode 213. Bonding pads 219a, 219b and 219c are formed in the main surface of silicon substrate 191. One region of impurity region 207 and bonding pad 219a are electrically connected by an aluminum interconnection layer 225a. Gate electrode 213 and bonding pad 219b are electrically connected by an aluminum interconnection layer 225b. The other region of impurity region 207 and bonding pad 219c are electrically connected by an aluminum interconnection layer 225c. Silicon substrate 191 in which MOS field effect transistors 197, 199 and 201 are formed is encapsulated by resin 195.

Figure 6:
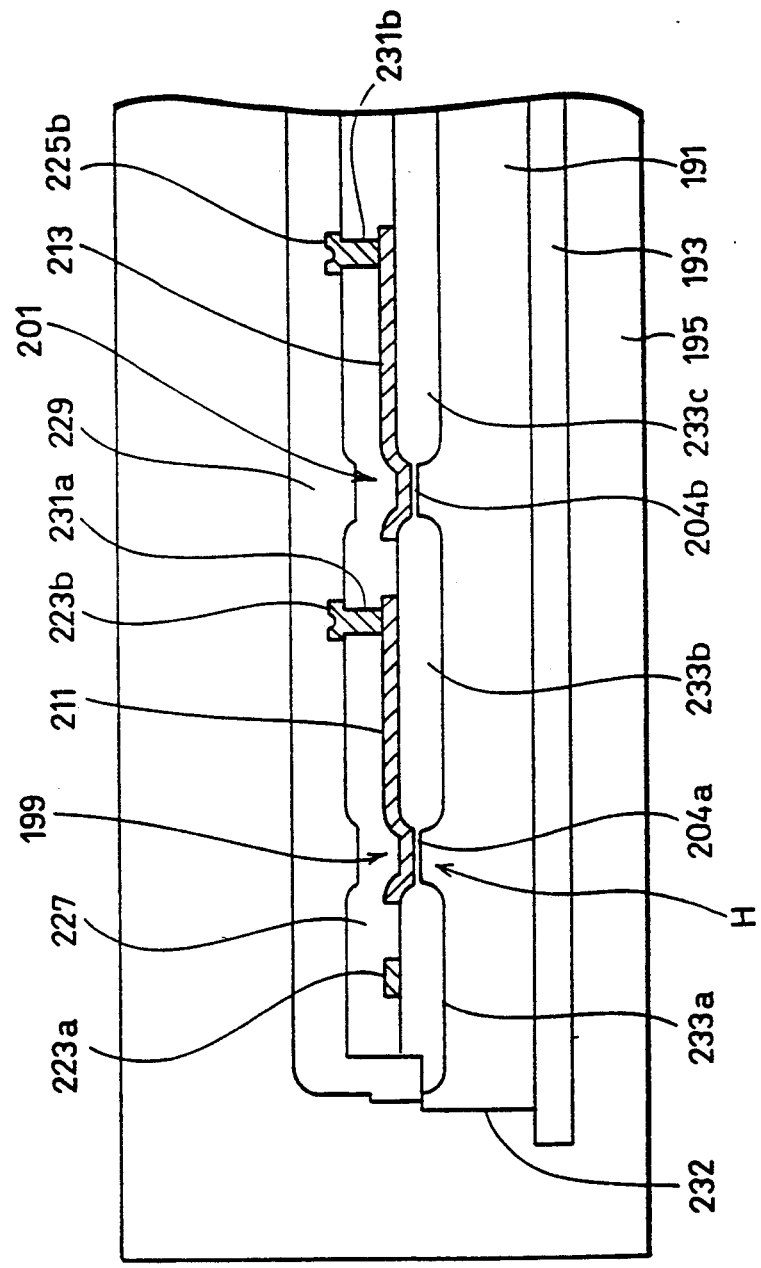
FIG. 6 is a sectional view of FIG. 5 taken along the direction of the arrow D.
Figure 7:
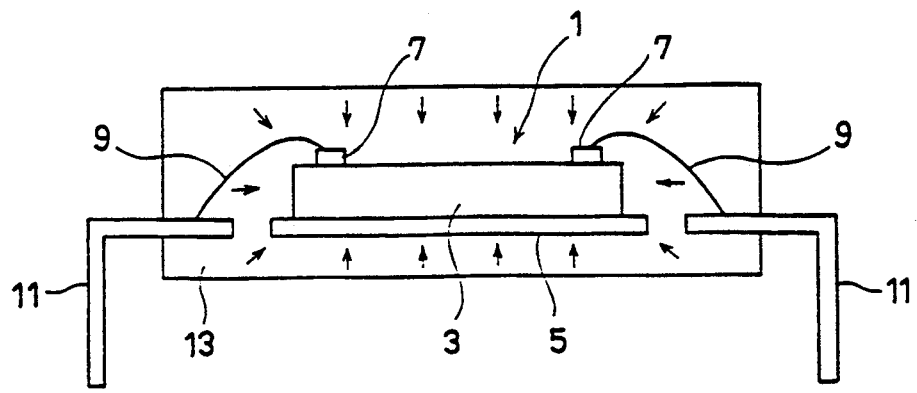
FIG. 7 is a front view of a conventional resin sealed TEG chip.
Figure 8:
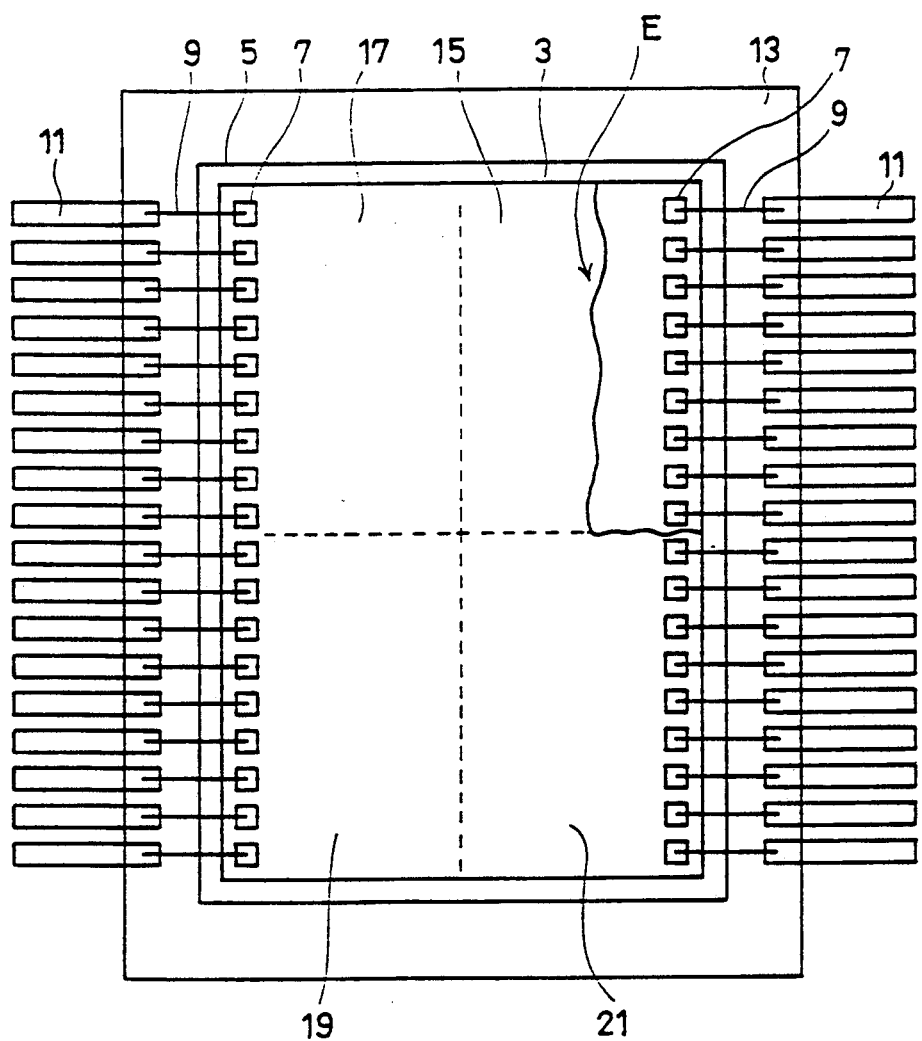
FIG. 8 is a plan view of a conventional resin sealed TEG chip.
Figure 9:
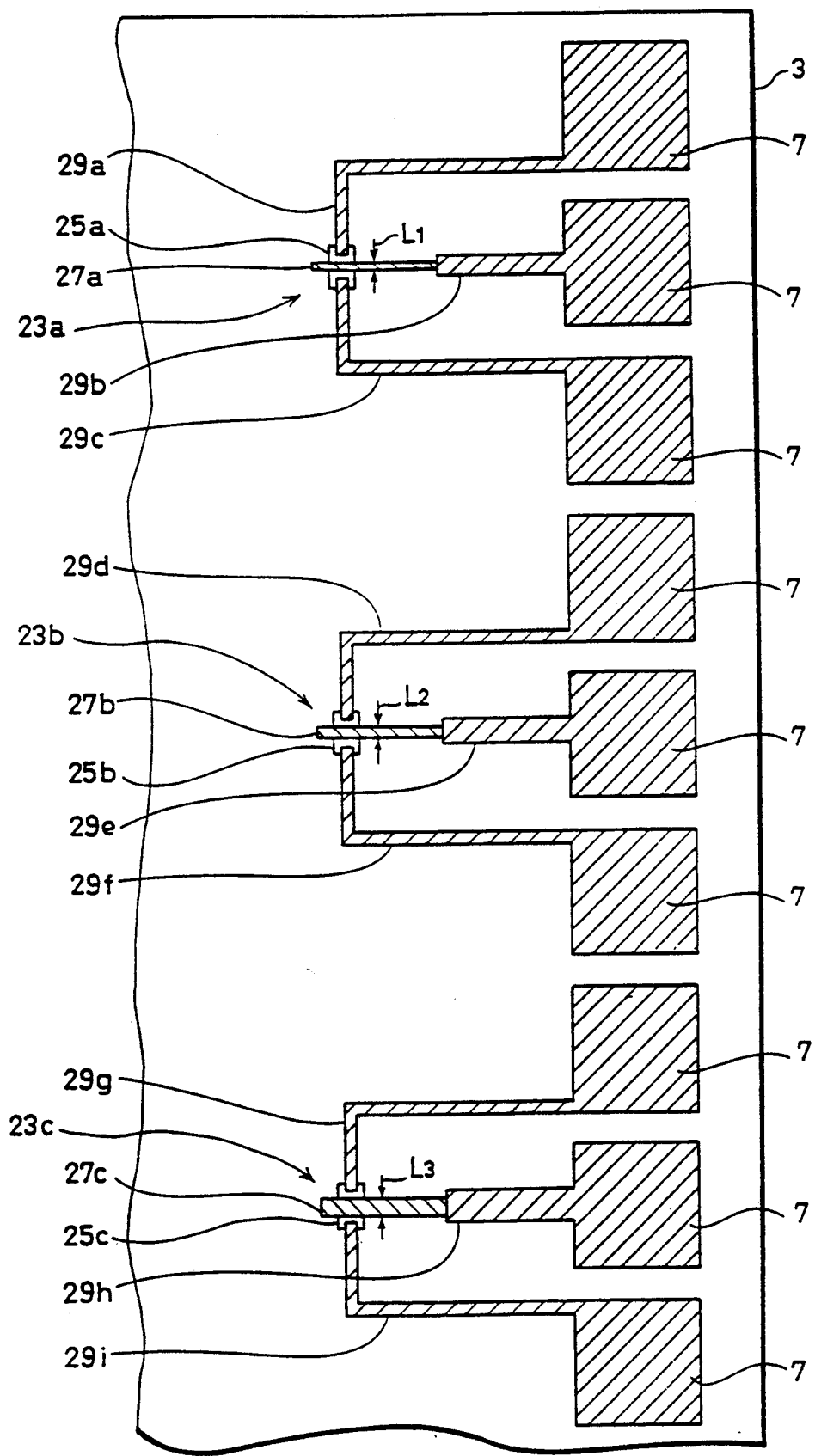
FIG. 9 is a partial sectional plan view of a portion designated by E of FIG. 8.
Figure 10:
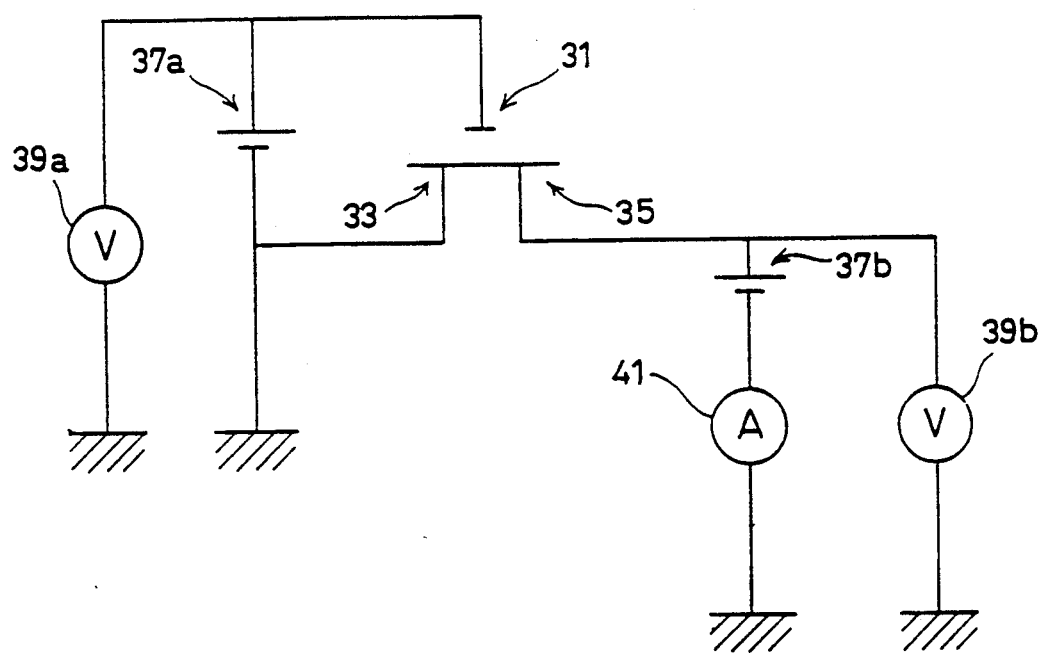
FIG. 10 is a diagram showing one example of a test for evaluating electric characteristics of an MOS field effect transistor.
Figure 11:
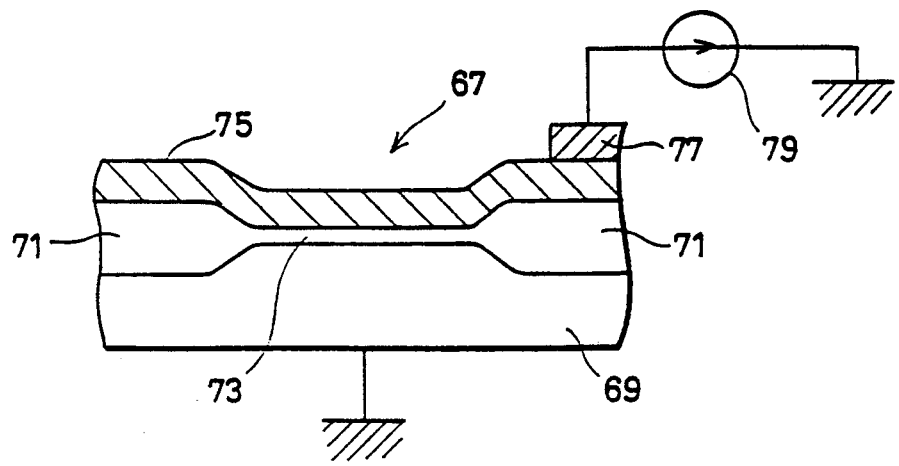
FIG. 11 is a sectional view of a MOS capacitor for use in testing.
Figure 12:
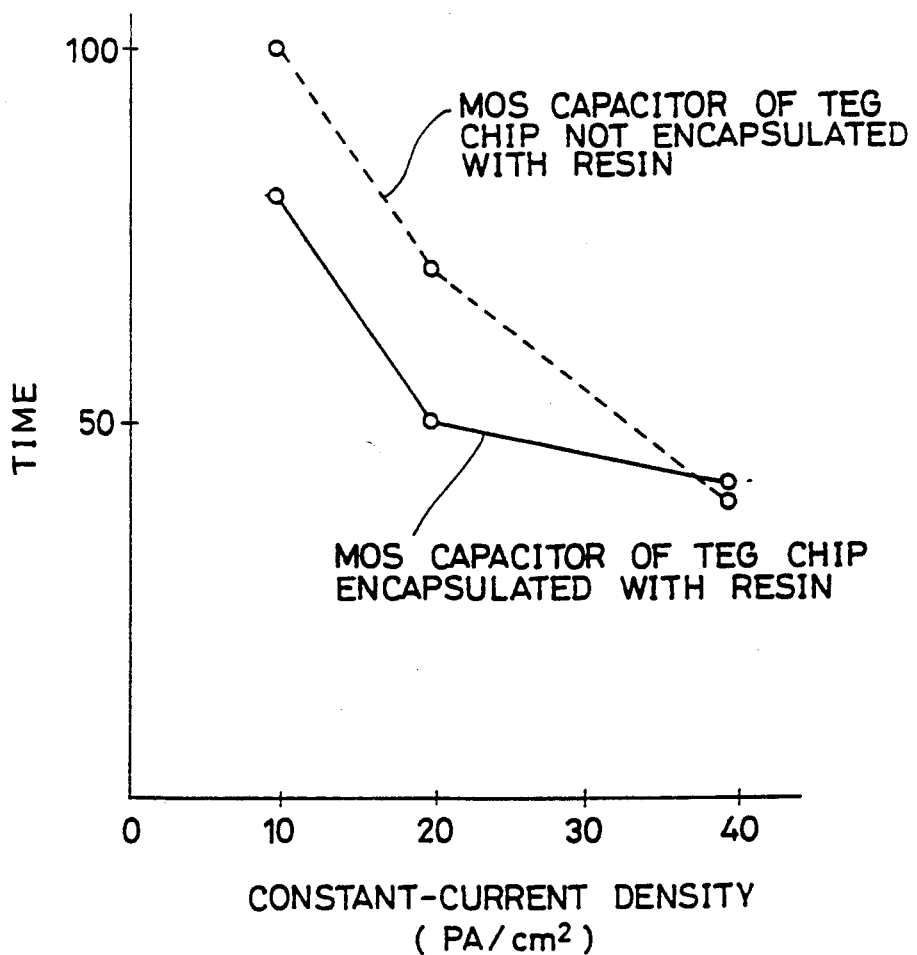
FIG. 12 is a graph showing a comparison between the electric characteristic of a MOS capacitor of a no-resin sealed TEG chip and the electric characteristic of a MOS capacitor of a resin sealed TEG chip.
Figure 13:
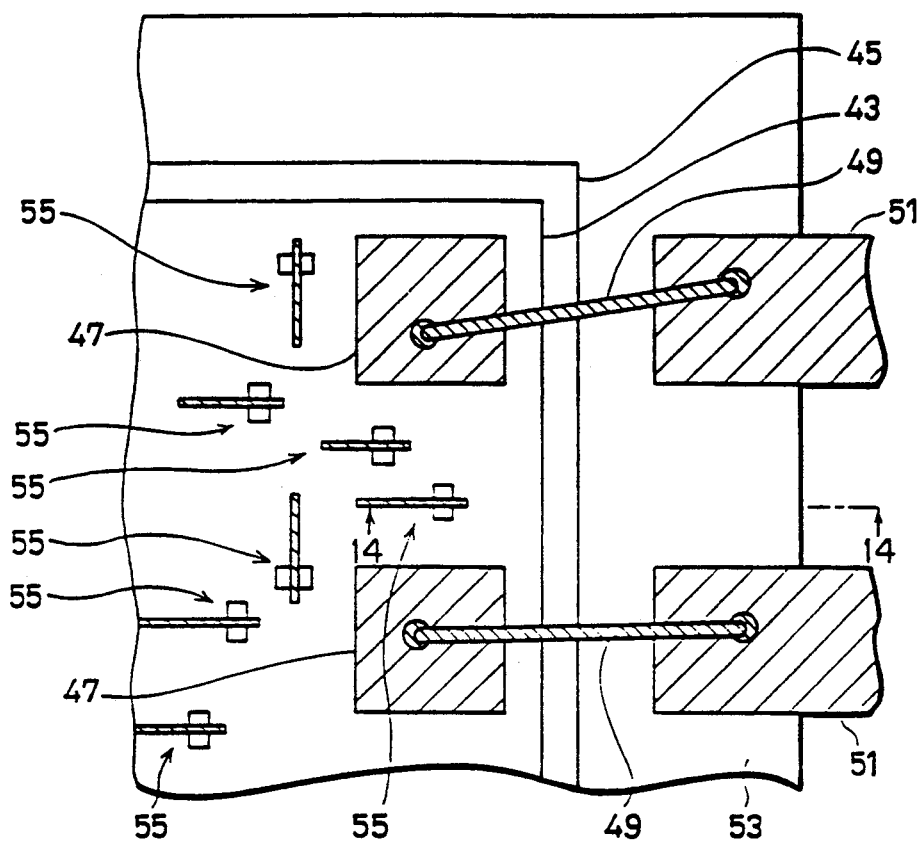
FIG. 13 is a partial plan view of a semiconductor device having electronic elements formed at an end portion of a main surface of a semiconductor substrate.
Figure 14:
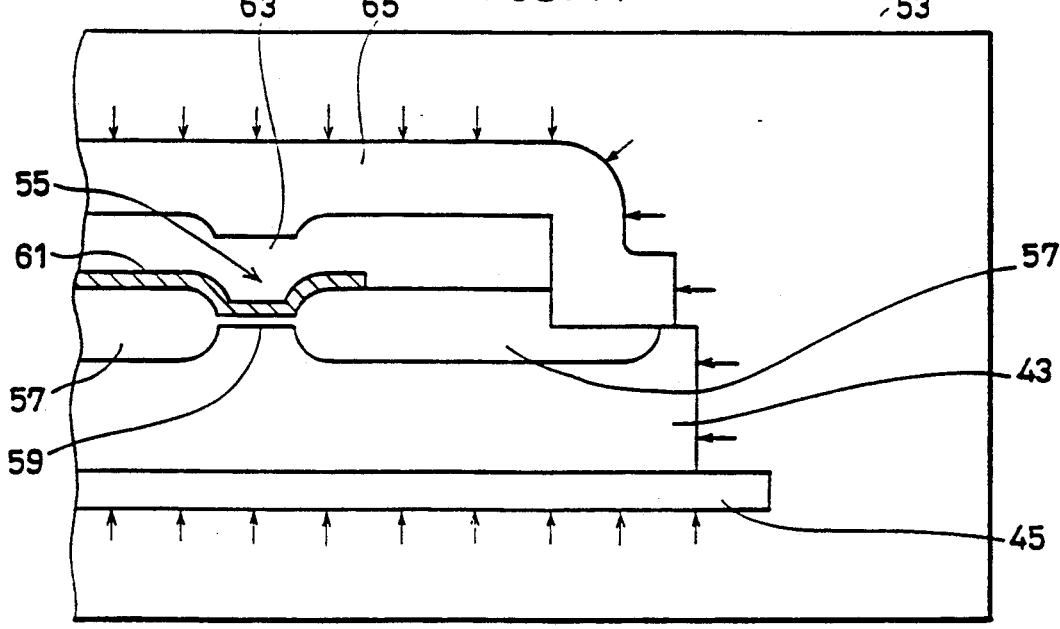
FIG. 14 is a sectional view of FIG. 13 taken along the direction of the arrow A.
Figure 15:
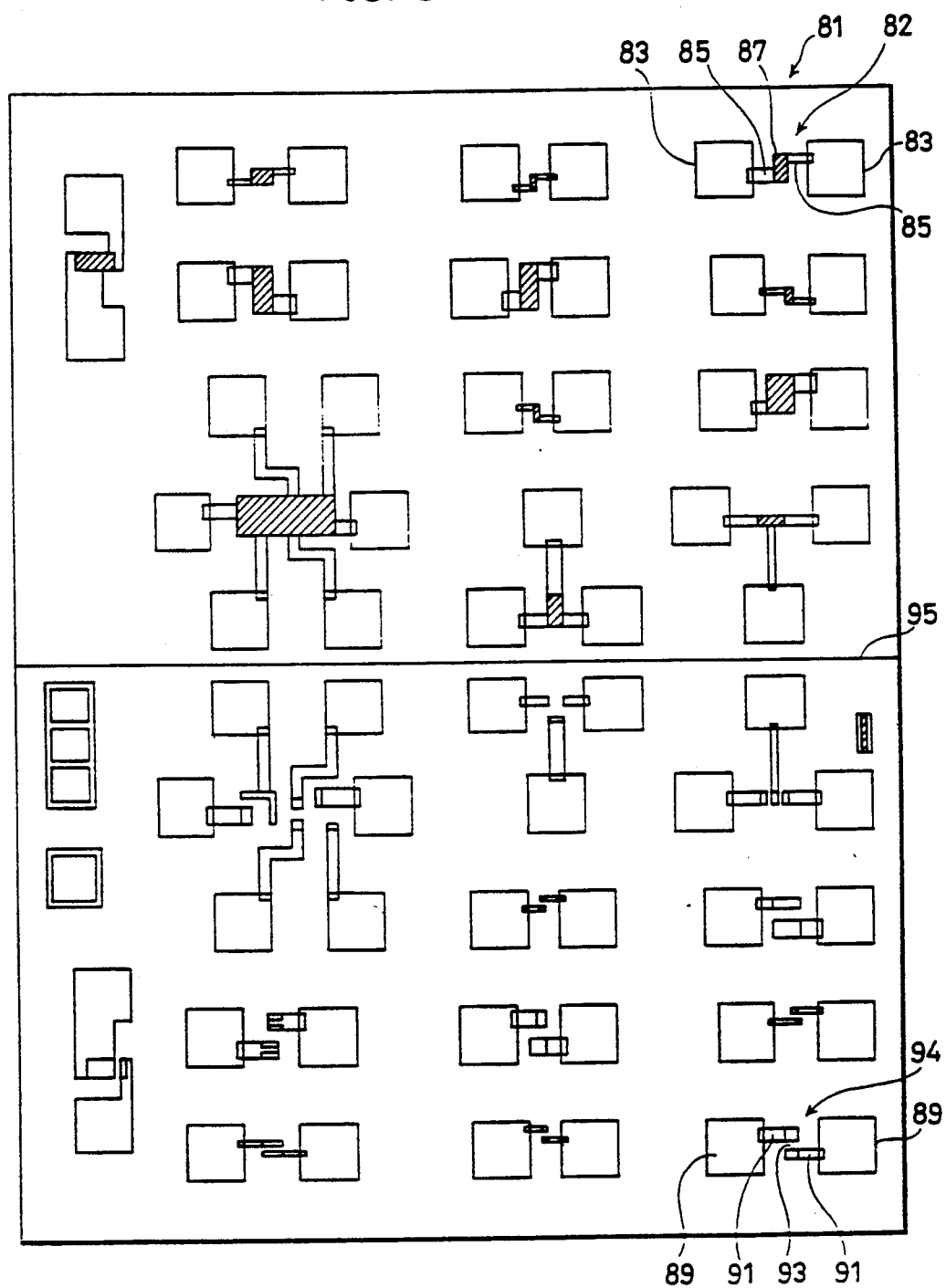
FIG. 15 is a plan view of a TEG chip having electronic elements formed at end portions of the substrate.

FIG. 6 is a diagram taken along the direction designated by D of FIG. 5. As shown in FIG. 6, silicon substrate 191 is mounted on a die pad 193. Field oxide films 233a, 233b, 233c and gate oxide films 204a, 204b are formed on the main surface of silicon substrate 191. A gate oxide film 204a is formed between field oxide film 233a and field oxide film 233b. A gate oxide film 204b is formed between field oxide film 233b and field oxide film 233c.

An aluminum interconnection layer 223a is formed on field oxide film 233a. A gate electrode 211 is formed on gate oxide film 204a and filed oxide film 233b. A gate electrode 213 is formed on gate oxide film 204b and field oxide film 233c. An interlayer insulating film 227 is formed on field oxide film 233a, gate electrode 211 and gate electrode 213. A contact hole 231a is formed in interlayer insulating film 227 located on gate electrode 211. An aluminum interconnection layer 223b is formed on interconnection insulating film 227. Aluminum interconnection layer 223b and gate electrode 211 are electrically connected by aluminum filled in contact hole 231a.

A contact hole 231b is formed in interlayer insulating film 227 located on gate electrode 213. An aluminum interconnection layer 225b is formed on interlayer insulating film 227. Aluminum interconnection layer 225b and gate electrode 213 are electrically connected by aluminum filled in contact hole 231b. A passivation film 229 is formed on interlayer insulating layer 227. Silicon substrate 191 in which passivation film 229 and the like are formed is encapsulated by resin 195.

MOS field effect transistor 201 shown in FIG. 5 is located at a position 60 μm away from outer perimeter 192. However, it is not likely to be subjected to the effect of the stress in the side direction of silicon substrate 191 among mechanical stresses due to the resin seal. The reasons will be described below. Referring to FIGS. 3 and 6, it is understood that field oxide film 233a shown in FIG. 6 serves as stress absorbing means. Also, a portion of silicon substrate 191 designated by H in FIG. 6 serves as stress transmission preventing means.

As shown in FIG. 6, MOS field effect transistor 199 is formed on a portion of silicon substrate 191 designated by H in this embodiment. Accordingly, as compared to the embodiment shown in FIG. 3, the silicon substrate main surface can be effectively utilized according to this embodiment.

A resin sealed semiconductor device for use in testing according to the present invention has a first electronic element and a second electronic element having the same types, dimensions and materials. The position where the first electronic element is formed and the position where the second electronic element is formed are subjected to different strength of mechanical stresses applied from the side direction of a semiconductor substrate. Accordingly, by comparing the electric characteristic of the first electronic element and the electric characteristic of the second electronic element, effect of the mechanical stresses due to the resin seal from the side direction of the semiconductor substrate can be evaluated. By examining the effect of the mechanical stresses, the reliability of a semiconductor device can be more precisely evaluated.

In a method of evaluating stresses due to the resin seal according to the present invention, electronic elements are formed in a region within 100 μm from an outer perimeter of a main surface of a semiconductor substrate. The electronic elements are encapsulated by resin. Focusing on the fact that the electronic elements exist in the region within 100 μm from the outer perimeter of the main surface of the semiconductor substrate, the electric characteristics of the electronic elements are measured. Accordingly, it can be evaluated to which extent the electronic elements in the region within 100 μm from the outer perimeter of the main surface of the semiconductor substrate are affected by the mechanical stresses due to the resin seal applied in the side direction to the semiconductor substrate. Thus, according to the present method, the reliability of a semiconductor device which has electronic elements formed in the region within 100 μm from the outer perimeter of the main surface of the semiconductor substrate can be precisely evaluated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin-sealed semiconductor device for use as a stress-test exemplar, comprising:

first and second electronic elements formed at selected locations in a main surface of a semiconductor substrate; and resin disposed so as to encapsulate said semiconductor substrate having said first and second electronic elements to seal the same against degradation by the ambient atmosphere, said resin causing mechanical stresses which influence testable electric characteristics of said first and second electronic elements means respectively connected to said first and second electronic elements to obtain therefrom electrical data indicative of a level of the respective mechanical stresses experienced by said first and second electronic elements, wherein the forms, dimensions and materials of said first and second electronic elements are identical, and said selected locations of said first and second electronic elements are selected so that a specific part of each of said electronic elements is distanced differently with respect to a side edge of the substrate to ensure that the first and second electronic elements are thereby subjected to respectively different magnitudes of said mechanical stresses in a side direction of said semiconductor substrate.

2. The resin-sealed semiconductor device according to claim 1, wherein:

a first distance determined between said first electronic element and a first part of an outer perimeter of said main surface that is nearest to said first electronic element is shorter than a second distance determined between said second electronic element and a second part of said outer perimeter that is nearest to said second electronic element.

3. The resin sealed semiconductor device according to claim 2, wherein:

said first distance is not more than 100 μm.

4. The resin sealed semiconductor device according to claim 3, wherein:

the second distance is not less than 100 m.

5. The resin sealed semiconductor device according to claim 1, wherein:

bonding pads respectively electrically connected to each of said electronic elements are formed outside corresponding regions connecting each of said electronic element and corresponding parts of outer perimeter nearest to each of said electronic elements.

6. The resin sealed semiconductor device according to claim 1, wherein:

said first and second electronic elements comprise MOS field effect transistors.

7. The resin sealed semiconductor device according to claim 1, wherein:
   the structure of a first region connecting said first electronic element and the outer perimeter of said main surface nearest to said first electronic element and the structure of a second region connecting said second electronic element and the outer perimeter of said main surface nearest to said second electronic element are different in their respective configurations.

8. The resin sealed semiconductor device according to claim 7, wherein:
   a stress transmission preventing means for preventing transmission of said mechanical stresses applied in a side direction o said semiconductor substrate is provided in said first region.

9. The resin sealed semiconductor device according to claim 8, wherein:
   a concave portion is formed in said first region; and
   a stress absorbing means for absorbing said mechanical stresses, formed of a material having an elastic coefficient smaller than that of said semiconductor substrate, is provided in said concave portion.

10. The resin sealed semiconductor device according to claim 8, wherein:
    a first concave portion is formed in said first region,
    a stress absorbing means for absorbing said mechanical stresses, formed of a material having an elastic coefficient smaller than that of said semiconductor substrate, is provided in said first concave portion,
    a second concave portion is provided between said first concave portion and said first electronic element in said first region, and
    a portion of said semiconductor substrate that is located between said first concave portion and said second concave portion serves as said stress transmission preventing means.

11. The resin sealed semiconductor device according to claim 10, wherein:
    said stress absorbing means comprises a silicon oxide film.

12. The resin sealed semiconductor device according to claim 7, wherein:
    first and second distances respectively determined between said first and second electronic elements and corresponding parts of the outer perimeter of said main surface nearest to said first and second electronic element are each not more than 100 m.

13. The resin sealed semiconductor device according to claim 7, wherein:
    a third electronic element is formed in said first region.

* * * * *